(12) United States Patent
Kim

(10) Patent No.: US 12,165,689 B2
(45) Date of Patent: Dec. 10, 2024

(54) MEMORY SYSTEM, REFRESH CONTROL CIRCUIT, AND REFRESH CONTROL METHOD

(71) Applicant: SAMSUNG ELECTRONICS CO., LTD., Suwon-si (KR)

(72) Inventor: Hoyoun Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 156 days.

(21) Appl. No.: 17/817,348

(22) Filed: Aug. 3, 2022

(65) Prior Publication Data

US 2023/0147402 A1 May 11, 2023

(30) Foreign Application Priority Data

Nov. 10, 2021 (KR) .......................... 10-2021-0154143
Feb. 9, 2022 (KR) .......................... 10-2022-0016768

(51) Int. Cl.
  G11C 16/04 (2006.01)
  G11C 11/406 (2006.01)
  G11C 11/408 (2006.01)

(52) U.S. Cl.
  CPC ........ *G11C 11/40611* (2013.01); *G11C 11/408* (2013.01)

(58) Field of Classification Search
  CPC .................... G11C 11/40611; G11C 11/408
  See application file for complete search history.

(56) References Cited

U.S. PATENT DOCUMENTS

| 9,047,978 | B2* | 6/2015 | Bell .................... G11C 7/1012 |
| 9,299,400 | B2 | 3/2016 | Bains et al. |
| 9,478,263 | B2 | 10/2016 | Ni et al. |
| 9,934,143 | B2 | 4/2018 | Bains et al. |
| 10,950,292 | B1 | 3/2021 | Seyedzadehdelcheh et al. |
| 11,651,812 | B2* | 5/2023 | Kim .................. G11C 11/40615 |
| | | | 365/222 |
| 2019/0095355 | A1 | 3/2019 | Timbert et al. |
| 2019/0096472 | A1 | 3/2019 | Kang et al. |
| 2020/0012600 | A1 | 1/2020 | Konoth et al. |
| 2020/0105722 | A1 | 4/2020 | Sethuraman et al. |
| 2020/0177392 | A1 | 6/2020 | Durham et al. |
| 2023/0118249 | A1* | 4/2023 | Go ...................... G11C 11/4087 |
| | | | 365/222 |

* cited by examiner

*Primary Examiner* — Pho M Luu
(74) *Attorney, Agent, or Firm* — F. CHAU & ASSOCIATES, LLC

(57) ABSTRACT

A refresh control circuit includes: a counting bloom filter that includes N hash control logics, each of which performs a hash operation on input data and outputs an M-bit sequence and M counters, each of which corresponds to a bit of the M-bit sequence, and updates count values of corresponding counters indicated by values of the M-bit sequences obtained from the N hash logics by using an address of a row of the memory cells as the input data; a candidate row determiner that determines rows of the memory cells accessed in a predetermined period in which the count values of the corresponding counters are greater than a threshold value as candidate rows for a target refresh operation; and a target refresh controller that outputs target refresh signals for rows of the candidate rows adjacent to one or more target rows determined by the candidate row determiner.

20 Claims, 13 Drawing Sheets

MEMORY SYSTEM, REFRESH CONTROL CIRCUIT, AND REFRESH CONTROL METHOD

CROSS-REFERENCE TO RELATED APPLICATION(S)

This application claims priority under 35 USC 119(a) from Korean Patent Application No. 10-2021-0154143, filed on Nov. 10, 2021, and No. 10-2022-0016768, filed on Feb. 9, 2022 in the Korean Intellectual Property Office, the contents of both of which are herein incorporated by reference in their entireties.

TECHNICAL FIELD

Embodiments of the present inventive concept are directed to a memory system that includes a memory device, a refresh control circuit of the memory device, and a refresh control method thereof.

DISCUSSION OF THE RELATED ART

A memory device includes memory cells connected to a plurality of word lines and bit lines. The memory cells connected to one word line form a row of the memory cells. As memory devices are increasing in density, the plurality of rows of memory cells in the memory device have a smaller distance therebetween, which increases an effect generated when adjacent rows of memory cells are coupled to each other.

Whenever data is input to or output from the memory cells, the word line toggles between an active state and an inactive state. This toggling can increase an effect generated when the adjacent rows of the memory cells are coupled to each other, which can lead to loss of data in a row of the memory cells, adjacent to a frequently-activated row of the memory cells. This phenomenon may be referred to as row hammering, and due to row hammering, data in the memory cell may be lost before the memory cell is refreshed.

SUMMARY

Embodiments provide a refresh control circuit, refresh control method and memory system that can efficiently select a row of memory cells for refreshing due to row hammering.

According to embodiments, a refresh control circuit for controlling refreshing of a plurality of rows of memory cells includes: a counting bloom filter including N hash control logics, wherein N is a positive integer, wherein each hash control logic performs a hash operation on input data and outputs an M-bit sequence and M counters, wherein M is a positive integer, wherein each counter corresponds to a bit of the M-bit sequence, and that updates count values of corresponding counters of the M counters indicated by values of the M-bit sequences obtained from the N hash logics by using an address of a row of the plurality of rows of the memory cells that is being accessed as the input data; a candidate row determiner that determines rows the memory cells for which the count values of the corresponding counters are greater than a threshold value as candidate rows for a target refresh operation in a predetermined period; and a target refresh controller that outputs target refresh signals for rows adjacent to one or more target rows of the candidate rows determined by the candidate row determiner.

According to embodiments, a memory system includes: a memory device that includes a plurality of rows of memory cells; and a controller that controls the memory device. The controller inputs the accessed rows of the plurality of the rows of the memory cells to a counting bloom filter, determines rows of the accessed rows as being frequently accessed as candidate rows, based on count values stored in the counting bloom filter, and controls the memory device to perform a target refresh operation on rows of the candidate rows that are adjacent to a determined target row.

According to embodiments, a refresh control method of a plurality of rows of memory cells includes: obtaining a plurality of result values of a first hash operation by inputting an address of a first row of the plurality of rows of the memory cells into a plurality of hash control logics, and updating count values of corresponding counters of a plurality of counters that are respectively indicated by the plurality of result values of the first hash operation, in a counting period; obtaining a plurality of result values of a second hash operation by inputting an address of a second row of the plurality of rows of the memory cells into the plurality of hash control logics, and determining the second row as a candidate row for a target refresh operation, based on count values of counters of the plurality of counters that are respectively indicated by the plurality of result values of the second hash operation, in a candidate selection period after the counting period; and performing the target refresh operation for rows adjacent to at least one target row of the candidate rows determined in the candidate selection period.

DETAILED DESCRIPTION

Hereinafter, embodiments will be described with reference to the accompanying drawings.

Figure 1:
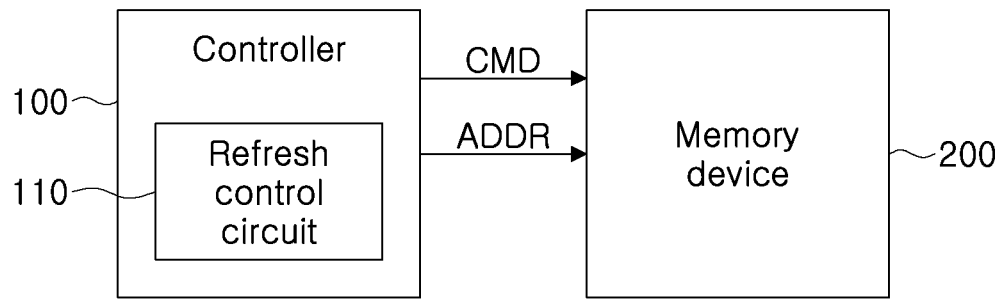
FIG. 1 is a block diagram of a memory system according to embodiments of the present inventive concept.

FIG. 1 is a block diagram of a memory system according to embodiments of the present inventive concept.

Referring to FIG. 1, in an embodiment, a memory system 10 includes a controller 100 and a memory device 200.

The controller 100 controls an operation of the memory device 200, based on a request of a host. For example, the controller 100 in FIG. 1 may be a memory controller included in a main processor of the host that controls the memory device 200, or may be a control logic integrated with the memory device 200 into one memory chip.

The memory device 200 receives a command CMD and an address ADDR from the controller 100, and performs an operation indicated by the command CMD and the address ADDR. The memory device 200 may require a refresh operation. For example, the memory device 200 may be a dynamic random access memory (DRAM), or another type of memory device that requires a refresh operation.

The memory device 200 includes rows of memory cells. The memory cells store an electric charge that corresponds to a data bit, and data stored in the memory cells is lost when the electric charge of the memory cells is lost over time. In addition, as described above, when a row is frequently activated due to row hammering, data stored in an adjacent row may also be lost.

The controller 100 includes a refresh control circuit 110 that controls a refresh operation to prevent data loss. The refresh control circuit 110 schedules an automatic refresh operation in which the rows of the memory device 200 are periodically refreshed. In addition, the refresh control circuit 110 further schedules a target refresh operation, which is an additional refresh operation that prevents data loss due to row hammering, in addition to the automatic refresh operation.

Unlike an automatic refresh operation in which the rows are sequentially refreshed, a target refresh operation refreshes a row determined to have a high probability of data loss due to row hammering. That is, the refresh control circuit 110 determines which row has a high probability of data loss and then schedules a target refresh operation, and the controller 100 transmits an address of the row to the memory device 200 together with an active command to control the target refresh operation.

The refresh control circuit 110 monitors the address of the row, transmitted with the active command to the memory device 200, to determine the probability of data loss, and determines which row is frequently accessed. In addition, the refresh control circuit 110 determines a row adjacent to the frequently-accessed row as the row having a high probability of data loss.

When counting accesses for each of the rows to determine the frequently-accessed row, the refresh control circuit 110 uses a plurality of counter resources. As the refresh control circuit 110 includes a larger number of counter resources, the memory system 10 might not be downsized and the memory system 10 may have increased power consumption.

On the other hand, when the refresh control circuit 110 omits access counting for some rows to reduce the counter resources used during access counting, data loss due to row hammering might not be prevented. For example, a malicious user could hack into the memory system 10 to find out which rows were omitted for the access counting. When the malicious user performs a row hammering attack by repeatedly accessed the corresponding row, the refresh control circuit 110 might not detect such accesses to the row and might not be able to prevent the data loss of the row adjacent to the corresponding row.

Accordingly, there is a need for a method in which the refresh control circuit 110 efficiently allows access counting to be performed for all accessed rows by using a limited number of counter resources.

According to embodiments of the present inventive concept, the refresh control circuit 110 allows access counting to be performed by inputting an address of an accessed row to a counting bloom filter. In addition, the refresh control circuit 110 estimates whether a row is frequently accessed based on a result of inputting an address of a certain row to the counting bloom filter, and control the target refresh operation performed on the row adjacent to the row estimated as being frequently accessed.

A bloom filter includes a bit-based data structure that probabilistically determines whether specific data is present in a set. To determine whether the specific data is present in the set, the specific data is input into a plurality of hash functions to obtain a plurality of result values, and the data structure then refers to the resulting bit values.

The counting bloom filter has a modified data structure of the bloom filter, and has a counter-based data structure that includes a plurality of counters. For the counting bloom filter to perform access counting for a row address, the row address is input into a plurality of hash functions to obtain a plurality of result values, and count values of the counters, indicated by the plurality of result values, are updated.

The hash function has a probability of collision, and accordingly, the counting bloom filter has a probability for a false positive but not a probability for a false negative. The refresh control circuit 110 thus performs the access counting without missing any accessed row even when the number of counter resources of the refresh control circuit 110 according to embodiments of the present inventive concept is less than the number of rows of the memory cells in the memory device 200. The refresh control circuit 110 thus efficiently performs access counting for all the accessed rows by using the limited counter resources, and effectively defends data against the intentional row hammering attacks. The memory device 200 thus has improved reliability.

Figure 2:
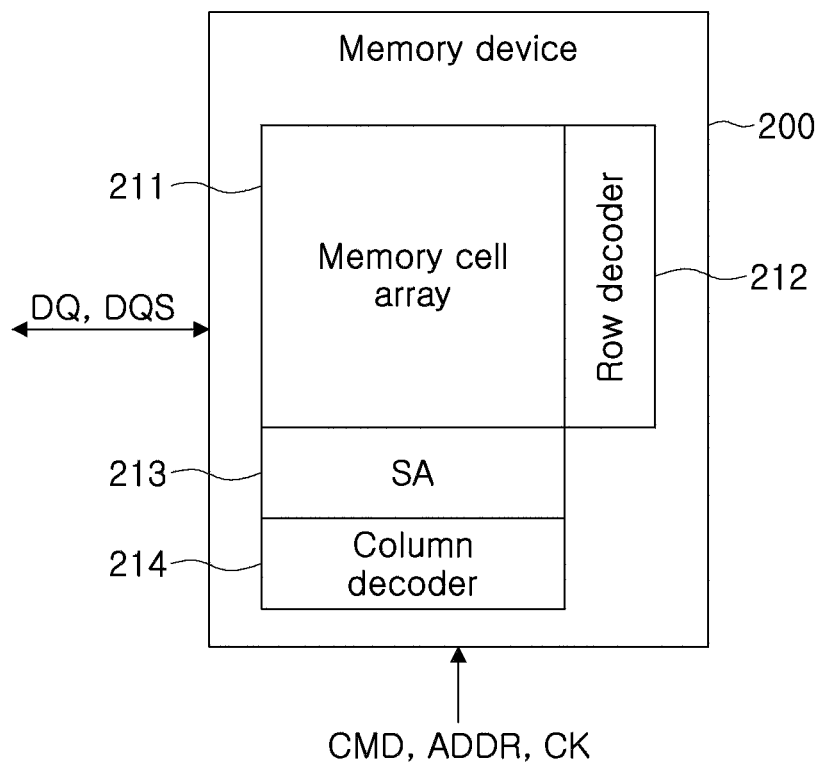
FIGS. 2 and 3 respectively illustrating a memory device according to embodiments of the present inventive concept.
Figure 3:
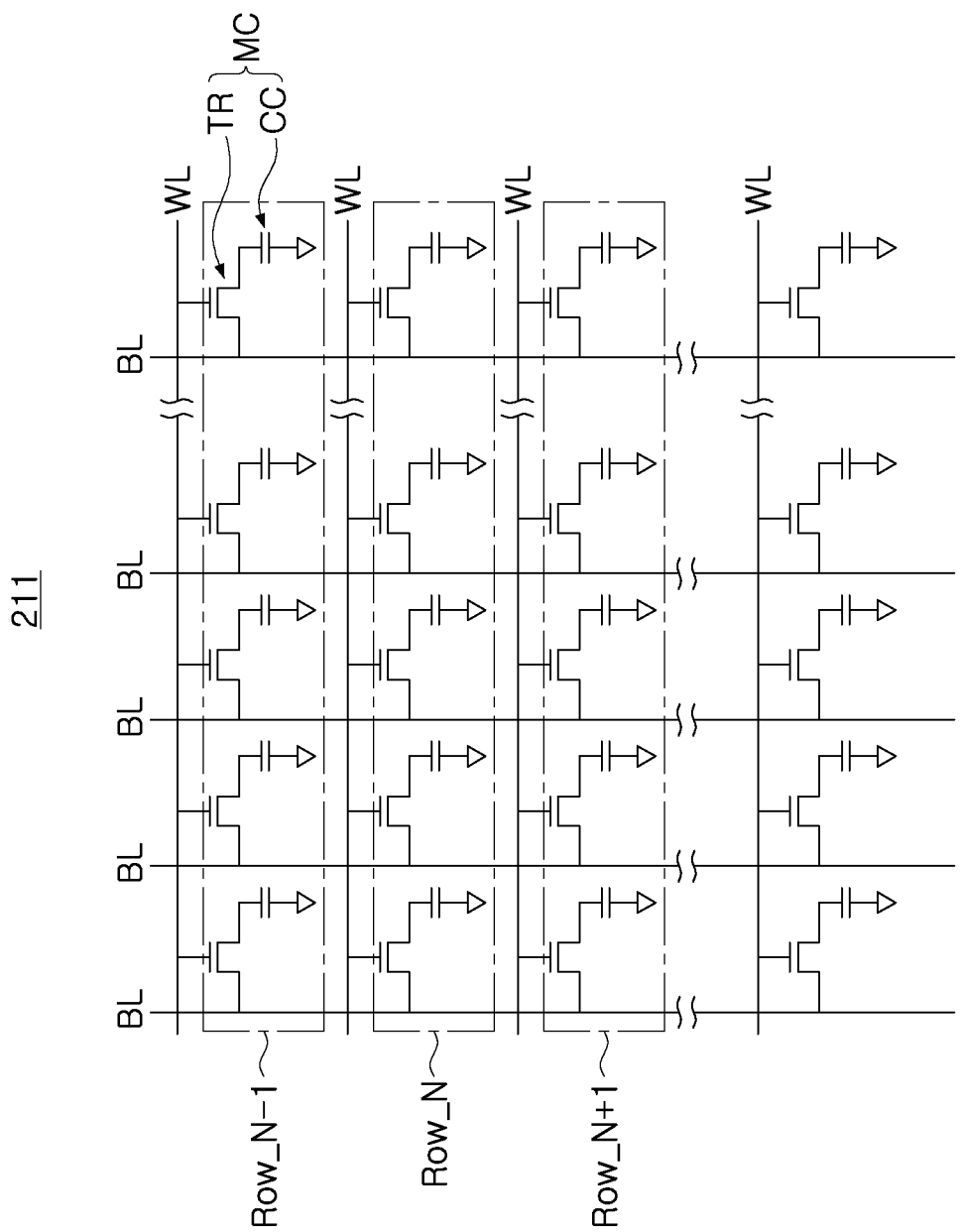

FIGS. 2 and 3 respectively illustrate a memory device according to embodiments of the present inventive concept.

The memory device 200 illustrated in FIG. 2 corresponds to the memory device 200 described with reference to FIG. 1. Referring to FIG. 2, in an embodiment, the memory device 200 includes a memory cell array 211, a row decoder 212, a sense amplifier 213 and a column decoder 214.

The controller 100 buffers a command CMD, an address ADDR and a clock signal CK that are received from an external device. In addition, the controller 100 transmits the buffered command CMD and address ADDR to the memory device 200, and transmits the buffered clock signal CK to the memory device 200 as an output clock signal that controls operations of the memory device 200.

The memory device 200 transmits and receives a data signal DQ and a data strobe signal DQS to and from the external device through a main channel. For example, the main channel may be at least one of a double data rate (DDR), a DDR2, a DDR3, a DDR4, a low power DDR (LPDDR), a universal serial bus (USB), a multimedia card (MMC), an embedded MMC, a peripheral component interconnection (PCI), a PCI-express (PCI-E), an advanced technology attachment (ATA), a serial-ATA, a parallel-ATA, a small computer small interface (SCSI), an enhanced small disk interface (ESDI), an integrated drive electronics (IDE), a firewire, a universal flash storage (UFS) or a nonvolatile memory express (NVMe).

A signal transmitted to the semiconductor module through the main channel is transmitted to the memory device 200 through a printed circuit board on which the memory device 200 and the control circuit are mounted. In addition, a signal transmitted by the control circuit to the memory device 200 is also transmitted through the printed circuit board.

The memory device 200 may be a volatile memory device, such as a dynamic random access memory (DRAM) device.

A DRAM is a type of random access memory that stores each bit of data in a capacitor in an integrated circuit. Each capacitor includes a charge state and a discharge state, and these two states represent two values, commonly referred to as 'zero (0)' and '1' of one bit. The electric charge stored in each capacitor in the DRAM may leak, and information stored in the capacitor can be lost when the electric charge in each capacitor is not periodically refreshed.

The memory cells provided by each capacitor of the DRAM are connected to the word lines and bit lines to form the memory cell array.

Referring to FIG. 3, in an embodiment, the memory cell array 211 includes a plurality of memory cells MC connected to bit lines BL and word lines WL, and each of the plurality of memory cells MC includes a cell switch TR and a cell capacitor CC. Data is stored in each of the plurality of memory cells MC by turning on the cell switch TR and charging or discharging the cell capacitor CC, and data stored in each of the plurality of memory cells MC can be read by turning on the cell switch TR and measuring a voltage of the cell capacitor CC.

The word line to which the memory cell is connected is activated before the memory cell is accessed, and the word line is pre-charged after the memory cell is accessed. The electric charge of the memory cells connected to a word line adjacent to the above word line may leak due such activation and pre-charge operations.

Referring to FIG. 3, in an embodiment, the memory cells MC connected to a single word line WL form a row of the memory cell array 211. For example, FIG. 3 illustrates an N-th row Row_N and rows Row_N−1 and Row_N+1 that are adjacent to the N-th row Row_N. When the N-th row Row_N is frequently accessed, a word line corresponding to the N-th row Row_N is frequently activated and pre-charged. The N-th row Row_N and the adjacent rows Row_N−1 and Row_N+1 are electrically coupled to each other, thus causing the row hammering in which data in the adjacent rows Row_N−1 and Row_N+1 is lost.

Hereinafter, a refresh control circuit and refresh control method that efficiently selects a row for a target refresh operation due to the row hammering are described in more detail with reference to FIGS. 4 to 10.

Figure 4:
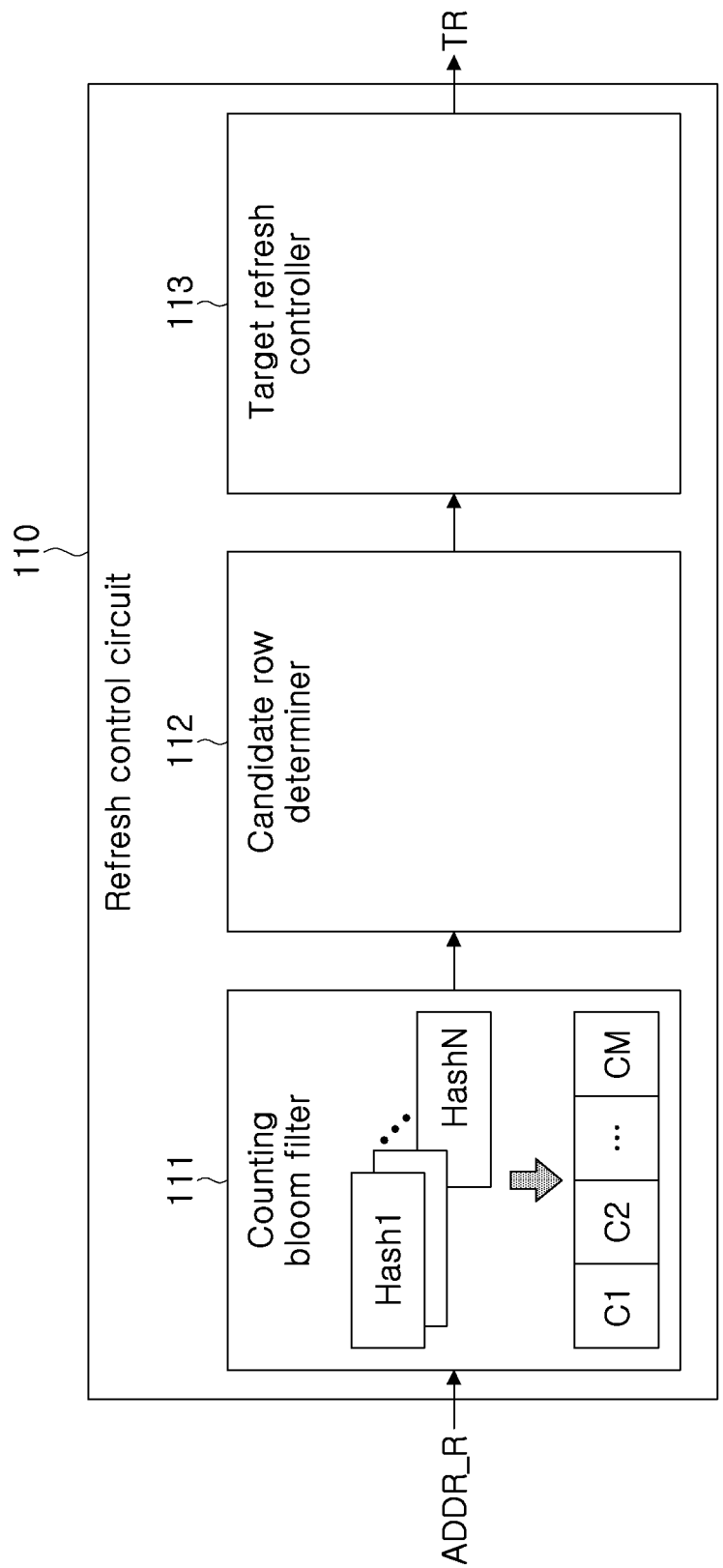
FIG. 4 is a block diagram of a refresh control circuit according to embodiments of the present inventive concept.

FIG. 4 is a block diagram of a refresh control circuit according to embodiments of the present inventive concept.

The refresh control circuit 110 illustrated in FIG. 4 corresponds to the refresh control circuit 110 described with reference to FIG. 1. The refresh control circuit 110 includes a counting bloom filter 111, a candidate row determiner 112 and a target refresh controller 113.

The counting bloom filter 111 includes M, where M is a positive integer, counters C1 to CM and N, where N is positive integer, hash logics Hash1 to HashN. The counters C1 to CM provide the counter-based data structure described above. The hash logics Hash1 to HashN generate M-bit sequences as result values by performing a hash operation on input data. Each bit of the M-bit sequences corresponds to one of counters C1 to CM, and the counting bloom filter 111 updates count values of counters as indicated by the M-bit sequences. The counting bloom filter 111 performs the hash operation by using an address of a row ADDR_R as the input data, and updates the count values of the counters indicated by hash operation result values.

In addition, values of N hash logics and values of M counters are freely selected based on a design. For example, the smaller values of N, the less computational resources for the hash operation can be consumed, and the larger values of N, the more tracing of the address of the row from the hash operation result values becomes challenging, thus increasing security of data against a row hammering attack. In addition, the smaller values of M, the less counter resources for access counting can be consumed, and the larger values of M, the less collisions between the hash operation result values can be occurred, thus increasing the accuracy of the access counting. Accordingly, each value of N and M is determined in advance in consideration of the computational resources and counter resources, the accuracy of the access counting, security, etc.

The candidate row determiner 112 determines a row being accessed in a predetermined period as being frequently accessed as a candidate row for the target refresh operation. As described above, result values that indicate some of the counters C1 to CM are generated when a row address is input into the hash logics Hash1 to HashN. Hereinafter, the counters indicated by the hash operation result values for the address of a frequently accessed row are referred to as corresponding row counters. The candidate row determiner 112 compares the count values stored in the corresponding row counters with a threshold value to estimate whether the row address is the address of a frequently-accessed row, and determines the rows as being frequently accessed as the candidate rows.

The target refresh controller 113 determines one or more rows of the candidate rows determined by the candidate row determiner 112 as target rows, and control the target refresh operation of the memory device 200 for rows adjacent to the target rows. For example, the target refresh controller 113 outputs a target refresh control signal TR that controls the target refresh operation. The controller 100 described with reference to FIG. 1 transmits the active command and addresses of the adjacent rows to the memory device 200 in response to the target refresh control signal.

Meanwhile, the refresh control circuit 110 schedules the target refresh operation so that the target refresh operation is periodically performed. In addition, the operation in which the candidate row determiner 112 selects the candidate row and the operation in which the target refresh controller 113 controls the target refresh operation are periodically performed. A period of the target refresh operation is described in detail with reference to FIGS. 5A and 5B.

Figure 5A:
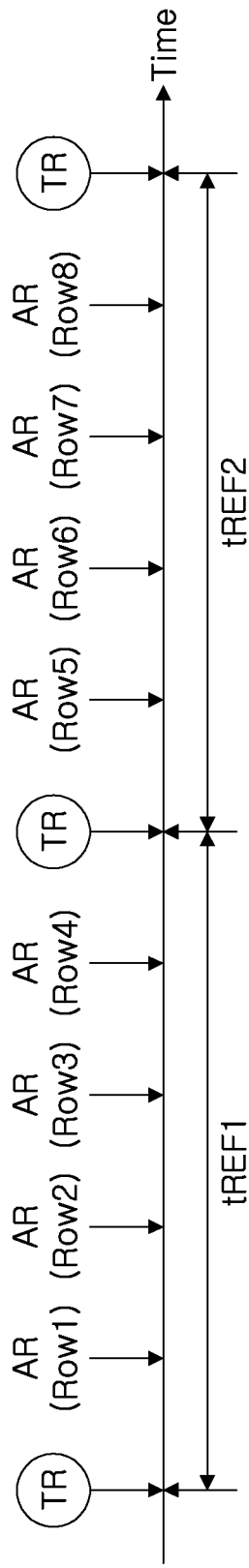
FIGS. 5A and 5B are timing diagrams of a period of a refresh operation according to embodiments of the present inventive concept.
Figure 5B:
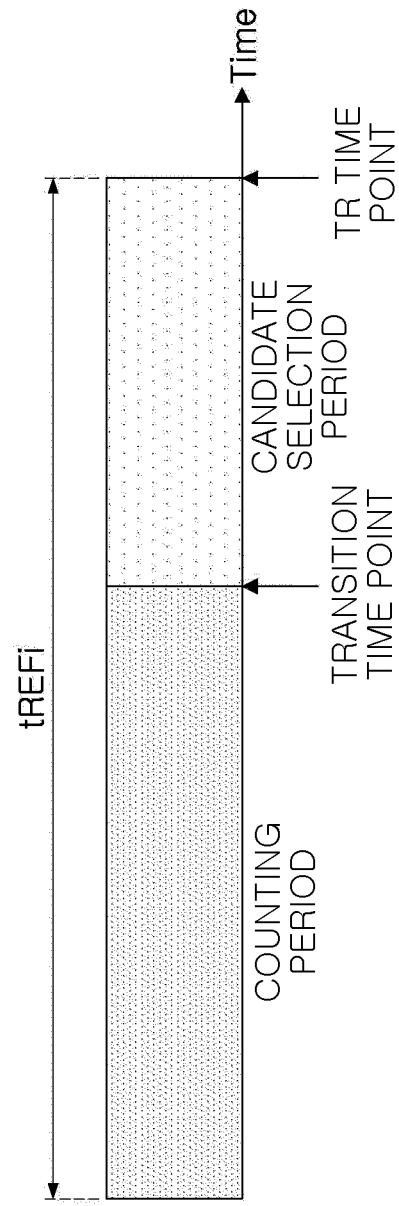

FIGS. 5A and 5B are timing diagrams of a period of a refresh operation according to embodiments of the present inventive concept.

FIG. 5A illustrates the period of the target refresh operation, according to an embodiment. The refresh control circuit 110 schedules automatic refresh operations AR for the rows of the memory cell array 211 to be sequentially refreshed. The refresh control circuit 110 schedules target refresh operations TR to be performed between the automatic refresh operations AR.

FIG. 5A illustrates on a time axis the times when the automatic refresh operations AR and the target refresh operations TR are performed. Referring to FIG. 5A, the automatic refresh operations AR are performed on first to fourth rows Row1 to Row4, the target refresh operation TR is performed, the automatic refresh operations AR are performed on fifth to eighth rows Row5 to Row8, and the target refresh operation TR are performed. That is, one target refresh operation TR is performed for every four automatic refresh operations AR.

FIG. 5A illustrates an embodiment in which the target refresh operation TR has a predetermined period, but embodiments of the present inventive concept are not necessarily limited thereto. For example, in an embodiment, the refresh control circuit 110 controls the target refresh operation TR to have a random period. That is, the duration of each reference time period tREF1 and tREF2 between adjacent target refresh operations TR may be predetermined, or may be randomly determined each time.

The refresh control circuit 110 performs the access counting for the accessed rows in the reference time period, and selects the candidate rows based on an access counting result. In addition, the refresh control circuit 110 controls the target refresh operation TR with reference to the candidate rows when the reference time period ends.

FIG. 5B illustrates an embodiment in which the access counting is performed and the candidate rows for a target refresh operation TR are selected in a random reference time period tREFi.

The reference time period tREFi includes a counting period and a candidate selection period. The refresh control circuit 110 performs the access counting on the accessed rows in the counting period, thereby collecting an access history of the row for selecting the candidate rows. In addition, the refresh control circuit 110 determines the candidate rows as being frequently accessed based on the row access history for the rows accessed in the candidate selection period after the counting period.

A time point within the reference time period at which the counting period changes to the candidate selection period may be referred to as a transition time point. The transition time point is a time point at which the access counting has been performed a sufficient number of times to determine the candidate rows, based on the rows accessed in the counting period. For example, the transition time point after more than half of the reference time period has elapsed. A time point after the candidate selection period at which the target refresh operation is performed may be referred to as a target refresh (TR) time point.

When the refresh control circuit 110 controls the target refresh operation based on a random period, it more challenging for a malicious user to determine the counting period and candidate selection period. A malicious user might not be able to perform a row hammering attack by repeatedly accessing a specific row by avoiding the candidate selection period, and data is more effectively protected from the row hammering attack.

Hereinafter, a target refresh control operation performed in one reference time period is described in detail with reference to FIGS. 6 to 8C.

Figure 6:
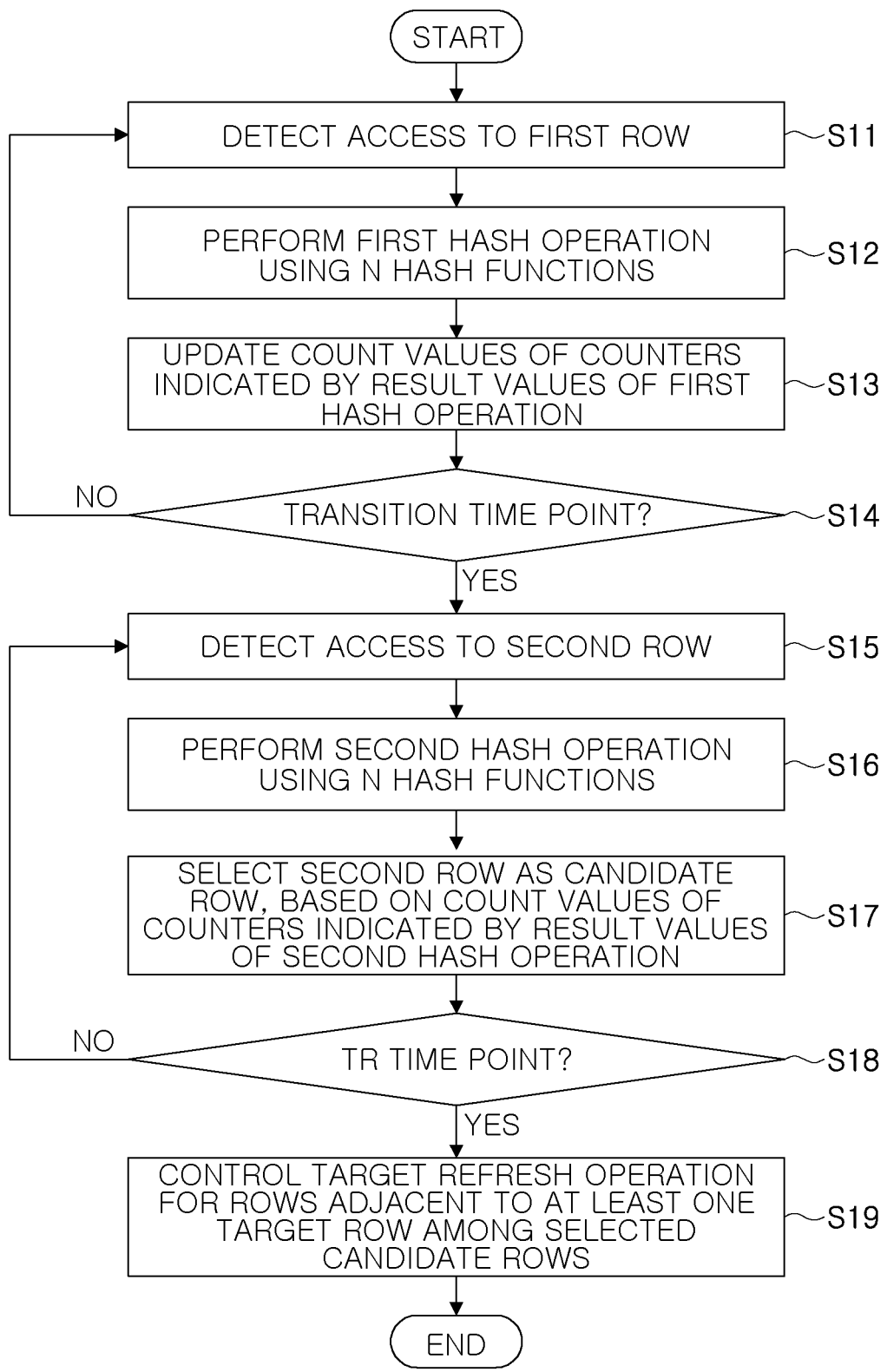
FIG. 6 is a flowchart of a refresh control method according to embodiments of the present inventive concept.
Figure 7:
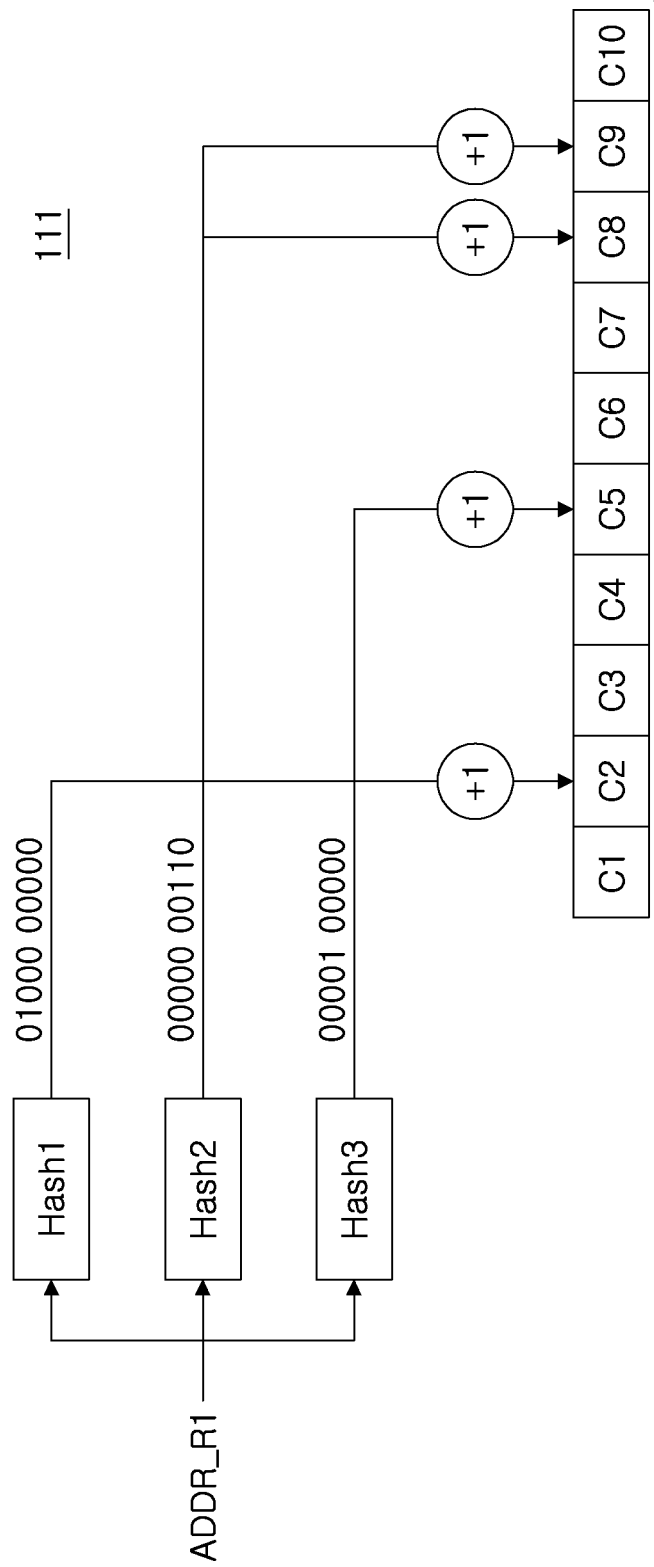
FIGS. 7 to 8C respectively illustrating a refresh control method according to embodiments of the present inventive concept.
Figure 8A:
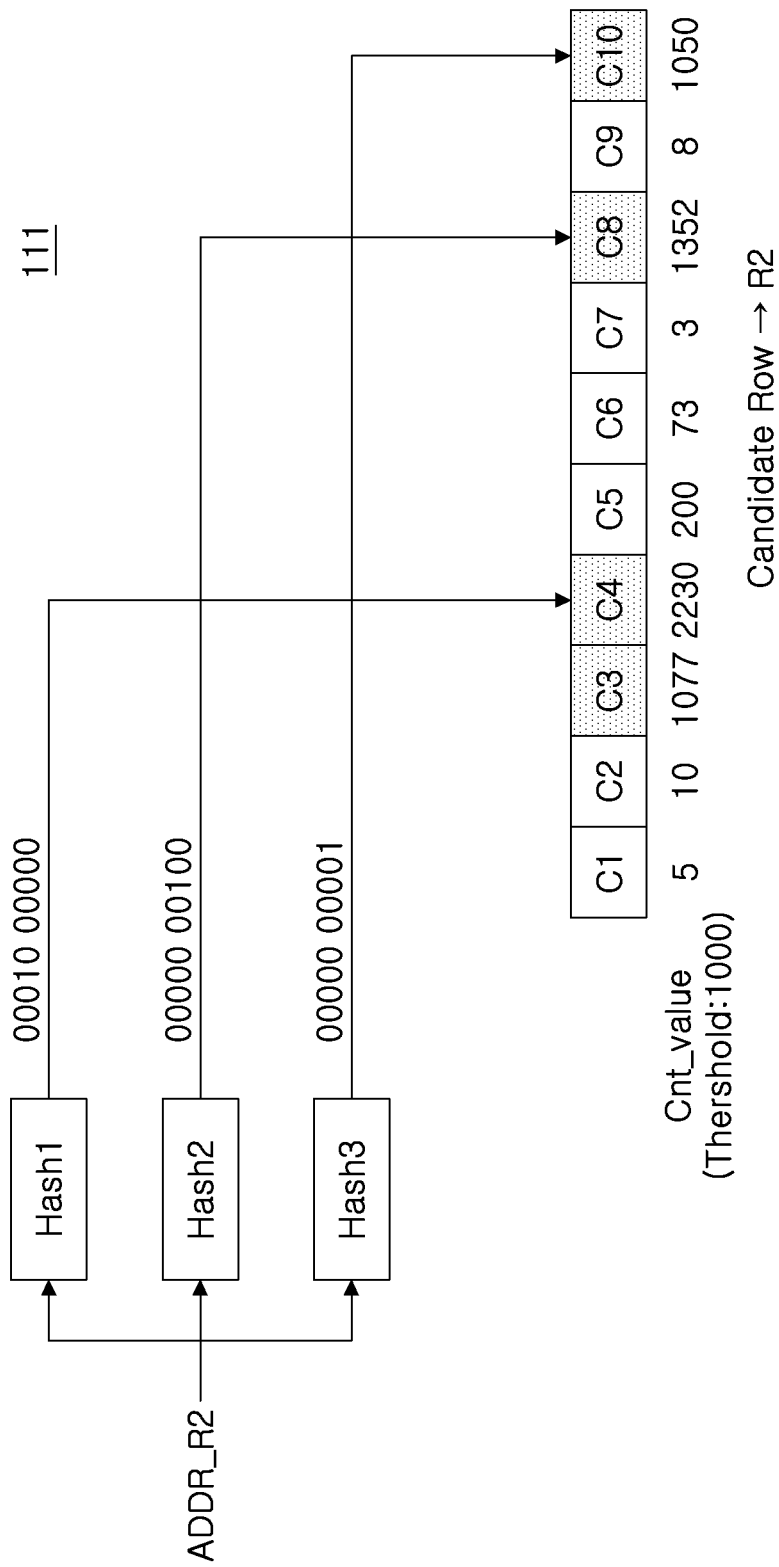
Figure 8B:
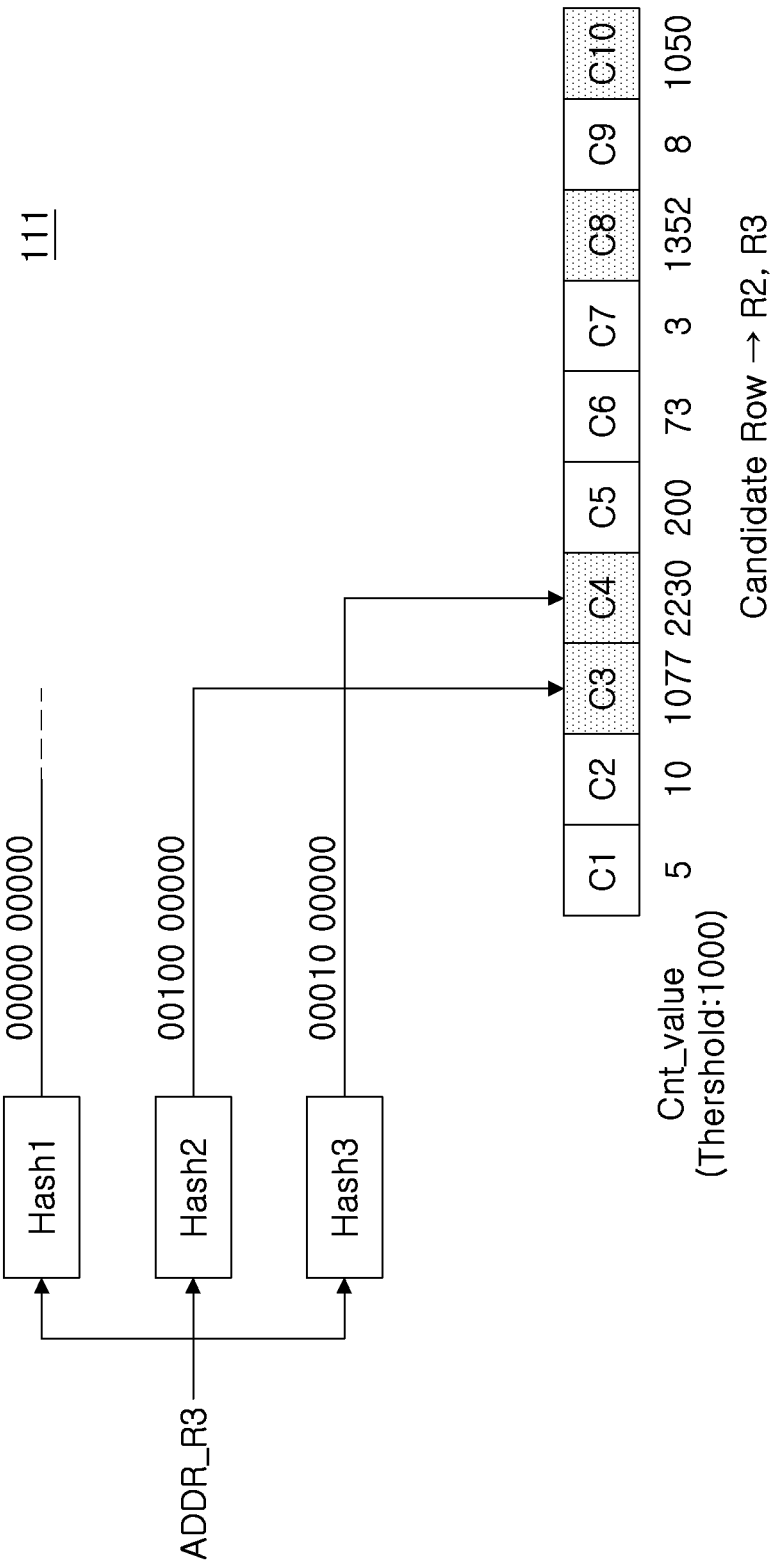
Figure 8C:
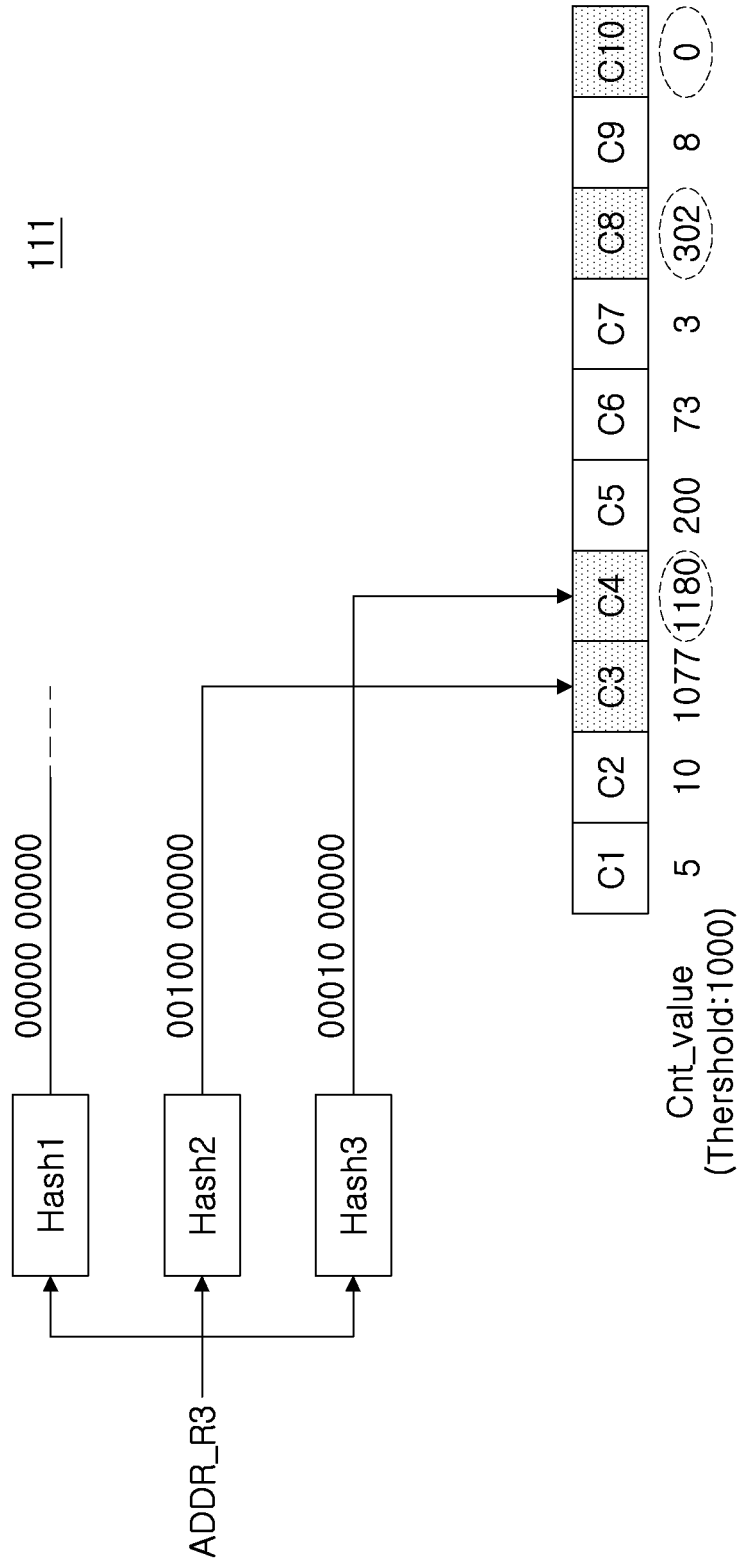

FIG. 6 is a flowchart of a refresh control method according to embodiments of the present inventive concept; and FIGS. 7 to 8C respectively illustrate a refresh control method according to embodiments of the present inventive concept.

In FIG. 6, in an embodiment, operations S11 to S13 indicate operations performed in the counting period, and operations S15 to S17 indicate operations performed in the candidate selection period. FIG. 7 illustrates operations performed in the counting period, and FIGS. 8A to 8C respectively illustrate operations performed in the candidate selection period.

Referring to FIG. 6, in an embodiment, access to the first row is detected in operation S11. In detail, the first row is any one of the plurality of rows in the memory cell array 211. The refresh control circuit 110 detects the access to the first row, based on the row address, transmitted to the memory device 200 together with the active command.

In operation S12, a first hash operation using N hash functions is performed. In detail, the counting bloom filter 111 performs the first hash operation by inputting an address of a first row to the N hash logics, and generates N result values. Each of the result values is the M-bit sequence, and each bit of the M-bit sequence corresponds to one of the M counters.

In operation S13, the count values of the counters indicated by the result values of the first hash operation are updated. In detail, the counting bloom filter 111 increases by a predetermined increment the count values of those counters indicated by the result values of the M counters.

FIG. 7 illustrates operations S12 and S13 by taking, as an example, a case in which the counting bloom filter 111 includes three hash logics Hash1 to Hash3 and ten counters C1 to C10.

Referring to FIG. 7, in an embodiment, an address of a first row ADDR_R1 is input to each of the hash logics Hash1 to Hash3. Each of the hash logics Hash1 to Hash3 outputs 10-bit sequences by performing a hash operation on the address of the first row ADDR_R1. Each bit of each 10-bit sequence corresponds to one of ten counters C1 to C10. In addition, each 10-bit sequence indicates a counter that corresponds to a bit having a value of '1'.

For example, in the 10-bit sequence '01000 00000' output from the first hash logic Hash1, the second bit has a value of '1', and the sequence indicates the second counter C2. Similarly, the sequence output from the second hash logic Hash2 indicates the eighth and ninth counters C8 and C9, and the sequence output from the third hash logic Hash3 indicates the fifth counter C5. The three 10-bit sequences output from the hash logics Hash1 to Hash3 indicate the second, fifth, eighth and ninth counters C2, C5, C8 and C9. The counters indicated by the sequences are referred to as the corresponding counters of the first row.

The count values of the corresponding counters of the rows accessed in the counting period are updated. In the example of FIG. 7, the count values of the second, fifth, eighth and ninth counters C2, C5, C8 and C9 are each increased by one (i.e., +1). FIG. 7 illustrates a case in which different sequences indicate different counters. However, different sequences may repeatedly indicate a certain counter depending on the hash operation result. The count value of the repeatedly indicated counter is increased by the number of times the counter is repeatedly indicated.

Referring back to FIG. 6, in an embodiment, whether the transition time point is reached is determined in operation S14. When the transition time point is not reached, for example, "No" in operation S14, the refresh control circuit 110 continuously performs the access counting for the accessed rows by repeatedly performing operations S11 to S13.

When the transition time point is reached, for example, "Yes" in operation S14, the counting period changes to the candidate selection period, and operation S15 is performed.

In operation S15, access to the second row is detected. In detail, the second row is any one of the plurality of rows in the memory cell array 211. The refresh control circuit 110 detects access to the second row based on the address of the row, which was transmitted to the memory device 200 together with the active command.

In operation S16, a second hash operation is performed using the N hash functions. In detail, the counting bloom filter 111 performs the second hash operation by inputting an address of a second row to the N hash logics and generates N result values. The first hash operation and the second hash operation are performed using the same N hash logics.

In operation S17, the second row is selected as the candidate row, based on the count values of the counters indicated by the result values of the second hash operation. For example, when the second row is a frequently-accessed row, the count values of corresponding counters of the second row are significantly greater as compared to the count values of other counters. Accordingly, the candidate row determiner 112 selects the second row as the candidate row when the count values of the corresponding counters are greater than the threshold value.

FIG. 8A illustrates operations S16 and operation S17 by taking, as an example, the case in which the counting bloom filter 111 includes three hash logics Hash1 to Hash3 and ten counters C1 to C10. The hash logics Hash1 to Hash3 illustrated in FIG. 8A perform the same hash operation as the hash logics Hash1-Hash3 illustrated in FIG. 7.

Referring to FIG. 8A, in an embodiment, counters corresponding to an address of a second row ADDR_R2 are determined to be the fourth, eighth and tenth counters C4, C8 and C10, based on the 10-bit sequences output as the hash operation result values on the address of the second row ADDR_R2. The hash logics Hash1 to Hash3 each output a unique 10-bit sequence from one input. That is, the count values of the fourth, eighth and tenth counters C4, C8 and C10 are updated whenever the address of the second row ADDR_R2 is accessed.

However, the hash functions may collide with each other, and the count values of the fourth, eighth and tenth counters C4, C8 and C10 are updated even when a row other than the second row is accessed. Accordingly, it cannot always be determined whether the second row is frequently accessed when the count value of just one of the fourth, eighth and tenth counters C4, C8 and C10 is greater than the threshold value. However, it can be estimated that the second row is frequently accessed when the count values of the fourth, eighth and tenth counters C4, C, and C10 are each greater than the threshold value. For example, the second row is estimated to be frequently accessed when a minimum value of the count values of the fourth, eighth and tenth counters C4, C8 and C10 is greater than the threshold value.

FIG. 8A illustrates a count value Cnt_value of each of counters C1 to C10. '1000' may be the threshold value of the count value. A counter of the counters C1 to C10 whose count value is greater than the threshold value, is illustrated in a dot pattern. In the example of FIG. 8A, a minimum value '1050' of the count values of the fourth, eighth and tenth counters C4, C8 and C10 that are corresponding counters of the second row is greater than the threshold value '1000', and the second row is determined as the candidate row.

The threshold of the count value is freely selected, based on the design. For example, when a certain row is repeatedly accessed, the threshold value is determined based on a limit access count, which is a count value for which data is normally maintained even when the row adjacent to the repeatedly-accessed row is not refreshed. For example, the threshold value is determined to be 1000 when the adjacent row normally maintains data until the row is accessed 1000 times even if the adjacent row is not refreshed.

The threshold value is determined in consideration of the values of the M counters in addition to the limit access count. A collision between the hash functions can cause an overestimation of the access count for each row. For example, it cannot always be determined whether the second row is accessed 1050 times or more even if '1050' is the minimum value of the count values of the corresponding counters in the second row. The tenth counter C10 may be counted by access to another row as well as to the second row, and the second row may actually be accessed less than 1050 times when the minimum value is '1050'. As the number of counters is smaller, the hash function have more collisions, and each counter may have a value that is greater than the actual number of accesses for each row. Accordingly, as the number of counters is decreased, the overestimation is compensated for by increasing the threshold value.

Meanwhile, the counter values of the corresponding counters of the rows accessed in the candidate selection period are also updated as in the case of the rows accessed in the counting period.

Referring back to FIG. 6, in an embodiment, whether the time point at which the target refresh operation is performed is reached is determined in operation S18. When the target refresh time point is not reached, for example, "No" in operation S18, the refresh control circuit 110 continuously selects the candidate row from the accessed rows by repeatedly performing operations S15 to S17.

FIG. 8B illustrates embodiments of the present inventive concept by taking, as an example, a case in which a third row is further accessed in a candidate selection section. The counting bloom filter 111 in FIG. 8B performs access counting by using the same three hash logics Hash1 to Hash3 and ten counters C1 to C10 as illustrated in FIGS. 7 and 8A.

Referring to FIG. 8B, in an embodiment, counters that correspond to an address of a third row ADDR_R3 are determined to be the third and fourth counters C3 and C4, based on the 10-bit sequences output as the hash operation result values by the address of the third row ADDR_R3. A minimum value '1077' of the corresponding counters of the address of the third row ADDR_R3 is greater than the threshold value, and the third row is further determined as a candidate row in the candidate selection section.

When the transition time point is reached, for example, "Yes" in operation S18, the target refresh operation for the rows adjacent to at least one target row of the candidate rows is controlled in operation S19.

There may be a limit to the number of rows that can be simultaneously refreshed in one target refresh operation. When the number of the rows adjacent to the candidate rows is greater than limit, the target refresh controller 113 selects the limit number of rows from the candidate rows as the target rows, and performs the target refresh operation on the rows adjacent to the target rows.

The target refresh controller 113 selects, as the target rows, rows estimated to have the highest number of accesses of the candidate rows. However, embodiments of present inventive concept are not necessarily limited thereto. For example, in an embodiment, the target refresh controller 113 selects the target rows by randomly selecting a limited number of rows from the candidate rows to quickly determine the target rows.

The target refresh controller 113 outputs the target refresh control signals for the rows adjacent to the target rows, and decreases the count values of the corresponding counters of the target rows. For example, the target refresh controller 113 determines the corresponding counters of the respective target rows by inputting the target rows to the counting bloom filter 111, and descreases the count values by subtracting the minimum value of the count values from the respective count values of the corresponding counters.

FIG. 8C illustrates the counting bloom filter 111 at a time point in a next reference time period after the target refresh control in operation S19 is completed, according to an embodiment. The counting bloom filter 111 in FIG. 8C performs access counting by using the same three hash logics Hash1 to Hash3 and ten counters C1 to C10 as illustrated in FIGS. 7, 8A and 8B.

In operation S19, the target refresh operation is performed on the rows adjacent to the second row when only the second row of the candidate rows is selected as the target row. In addition, the count values of the fourth, eighth and tenth counters C4, C8 and C10 that are the corresponding counters of the second row are decreased by the minimum value '1050'. The count values shown in FIG. 8C illustrate the count values that are decreased after the target refresh operation.

The count values of the corresponding counters may be decreased by the minimum value to approximately decrease the count values of the corresponding counters by the count value counted by the target row. For example, in the examples of FIGS. 8A and 8B, the count value of the fourth counter C4 is updated when the second row is accessed and is also counted when the third row is accessed. When a count value '2230' of the fourth counter C4, illustrated in FIG. 8B, is decreased by '1050', values counted by the third row in the count value of the fourth counter C4 are generally maintained.

In the example of FIG. 8C, the third row is accessed again in the candidate row selection section of the next reference time period. As described with reference to FIG. 8B, the corresponding counters of the third row are determined as the third and fourth counters C3 and C4. The minimum value '1077' of the count values of the corresponding counter is greater than the threshold value, and the third row is selected again as the candidate row. That is, candidate rows not selected as the target rows in a certain reference time period may be selected again as the candidate rows in the next reference time period, and may have a chance to be selected as target rows.

When the automatic refresh operation is performed on a certain row, the counting bloom filter 111 decreases the count value of the counter that corresponds to the row adjacent to the certain row. When the automatic refresh operation is performed on the row adjacent to the frequently-accessed row before the target refresh operation is performed on the adjacent row, data loss of the row can be prevented even though the target refresh operation has not been immediately performed thereon. Therefore, when an automatic refresh operation is performed on a certain row, the count value of the corresponding counter of the rows adjacent to the certain row are decreased so that a target refresh operation is not immediately performed on the certain row.

According to embodiments of the present inventive concept, the refresh control circuit 110 performs access counting for the rows by using the counting bloom filter, thereby tracking the access histories of all rows by using the limited number of counter resources. Therefore, a row can be determined as the target row and the target refresh operation can be performed even when a malicious user repeatedly accesses a row to perform a row hammering attack.

Hereinafter, an example is described with reference to FIGS. 9 and 10 in which the refresh control circuit 110 prevents a malicious row hammering attack.

Figure 9:
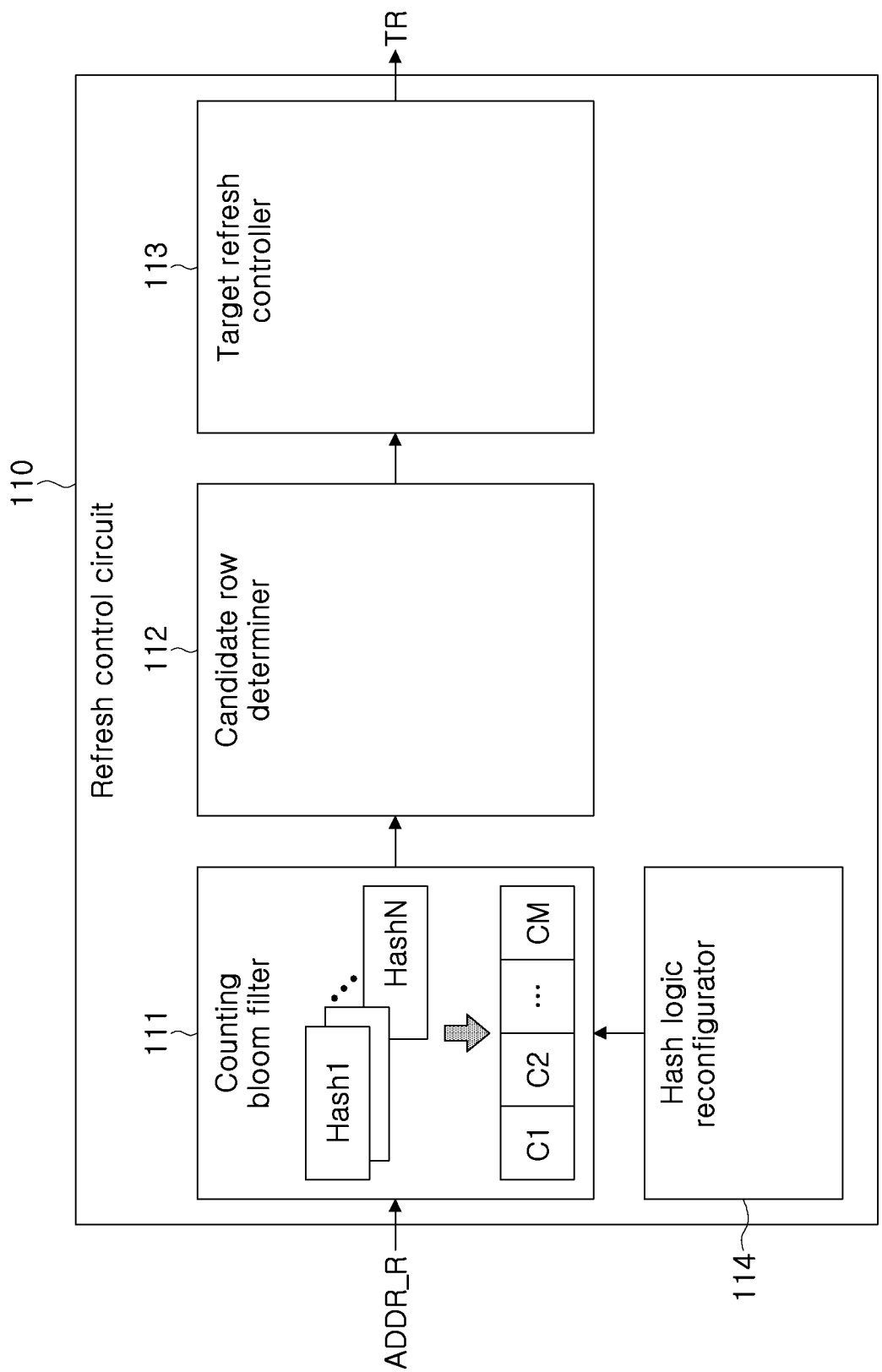
FIG. 9 is a block diagram of a refresh control circuit according to embodiments of the present inventive concept.

FIG. 9 is a block diagram of a refresh control circuit according to embodiments of the present inventive concept.

The counting bloom filter 111, the candidate row determiner 112 and the target refresh controller 113 in the refresh control circuit 110 in FIG. 9, correspond to those described with reference to FIG. 4. The refresh control circuit 110 in FIG. 9 further includes a hash logic reconfigurator 114.

The hash logic reconfigurator 114 reconfigures the N hash logics by periodically changing the N hash logics in the counting bloom filter 111. For example, each of the N hash logics includes a plurality of logic gates, and the hash function of each of the hash logics is defined based on a connection structure of the logic gates. According to embodiments of the present inventive concept, the hash logic reconfigurator 114 changes the connection structure of each of the hash logics, thereby changing the hash function of each of the hash logics.

Figure 10:
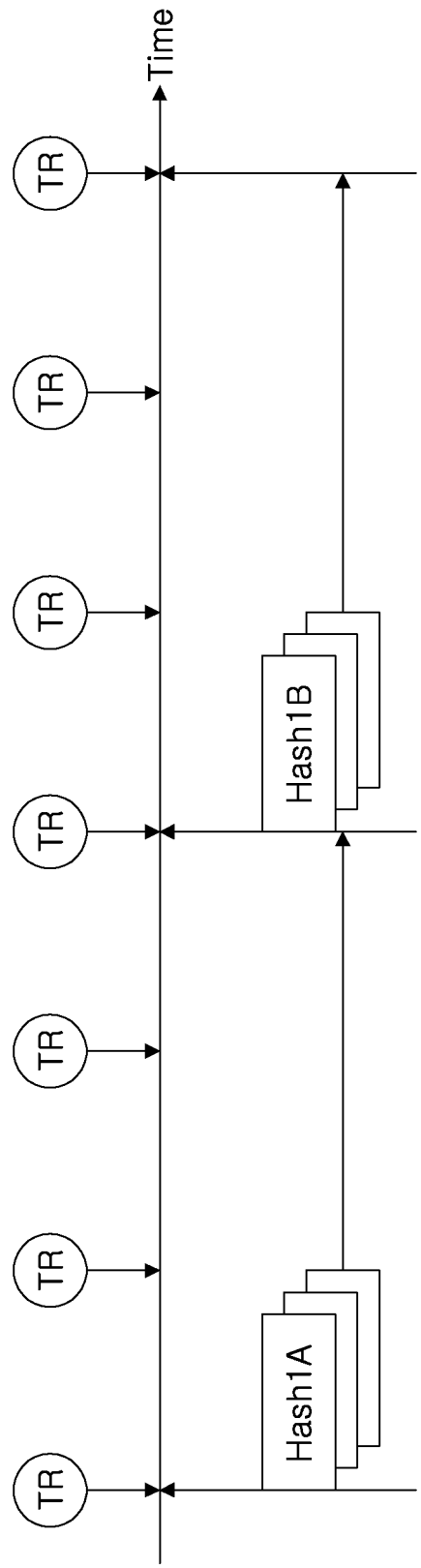
FIG. 10 is a timing diagram of a refresh control method according to embodiments of the present inventive concept.

FIG. 10 is a timing diagram of a refresh control method according to embodiments of the present inventive concept.

FIG. 10 illustrates the time points on the time axis at which the target refresh operations (TR) are performed. The hash function applied to the hash logic periodically changes. For example, the counting bloom filter performs access counting by using the hash functions that include Hash1A and selects the candidate rows. In addition, after a certain time point, the counting bloom filter performs access counting by using changed hash functions that include Hash1B and selects the candidate rows.

When the hash function of the hash logics is fixed, a malicious user may guess which of the M counters has fewer hash collisions by repeatedly accessing several rows. In addition, a malicious user may repeatedly access a row that has counters with the fewest hash collisions as the corresponding counters, to make it challenging to detect the frequently-accessed rows, thereby performing a row hammering attack while avoiding a target refresh.

However, the corresponding counter of each of the rows changes when the hash function of the hash logics changes, according to embodiments of the present inventive concept. For example, a malicious user may determine a strategy to avoid the target refresh while the counting bloom filter performs the target refresh operation using hash functions that include Hash1A. However, the strategy of the malicious user may be rendered meaningless at a time point when the counting bloom filter performs the target refresh operation by using changed hash functions that include Hash1B. Therefore, a malicious user might not be able to perform a row hammering attack while avoiding the target refresh, thereby increasing security against row hammering attacks.

Hereinafter, examples of a memory system that uses a refresh control circuit and a refresh control method according to embodiments of the present inventive concept will be described with reference to FIGS. 11 and 12.

Figure 11:
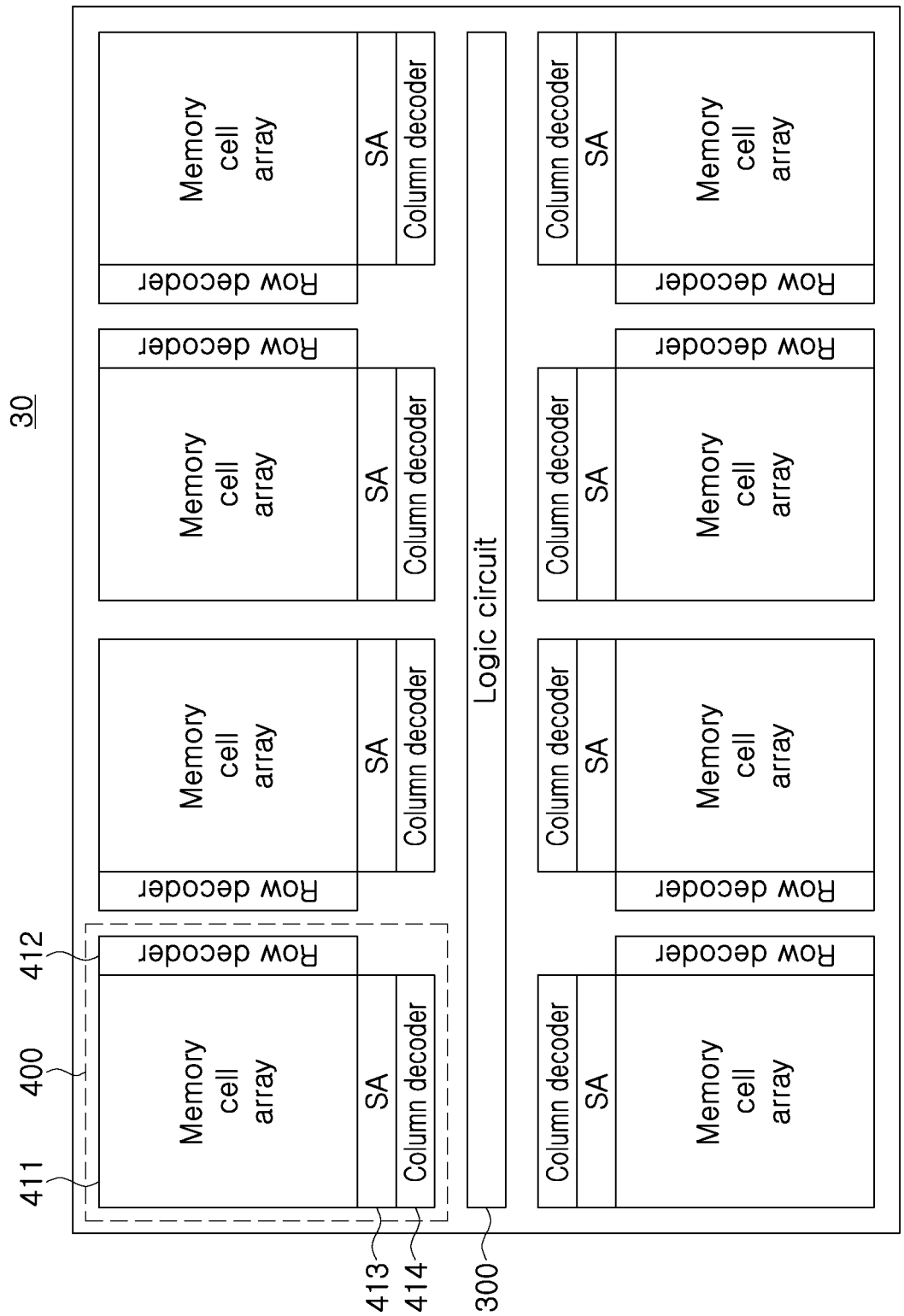
FIG. 11 illustrates a semiconductor module that includes a memory system according to embodiments of the present inventive concept.

FIG. 11 a memory system according to embodiments of the present inventive concept.

Referring to FIG. 11, in an embodiment, a semiconductor device 30 corresponds to the memory system, and the semiconductor device 30 includes a plurality of unit memory devices 400 and a control logic circuit 300. The plurality of unit memory devices 400 and the control logic circuit 300 may be included in one memory chip.

The unit memory device 400 corresponds to the memory device 200 described with reference to FIG. 2. For example, when the unit memory device 400 is a dynamic random access memory (DRAM), the unit memory device 400 is a memory bank. Each of the plurality of unit memory devices 400 includes a memory cell array 411, a row decoder 412, a sense amplifier circuit 413, a column decoder 414, etc.

Operations of the plurality of unit memory devices 400 are controlled by the control logic circuit 300. The control logic circuit 300 stores data received from an external device in at least one of the plurality of unit memory devices 400, or reads data from at least one of the plurality of unit memory devices 400, based on address information received from the external device and outputs the data to the external device.

In addition, the control logic circuit 300 includes an input/output circuit that transmits and receives a signal to or from the external device. The plurality of unit memory devices 400 are disposed on both sides of the control logic circuit 300, and the control logic circuit 300 is disposed in a center region of the semiconductor device 30.

The control logic circuit 300 corresponds to the controller 100 described with reference to FIG. 1, and includes the refresh control circuit. According to embodiments of the present inventive concept, the control logic circuit 300 efficiently counts the rows accessed by the plurality of unit memory devices 400 by using a counting bloom filter that includes a limited number of counter resources. In addition, the control logic circuit 300 estimates whether the row is the frequently-accessed row based on the result of inputting the row to the counting bloom filter, and performs a target refresh operation on the rows adjacent to the row based on an estimation result. Therefore, the control logic circuit 300 prevents data loss due to row hammering.

Figure 12:
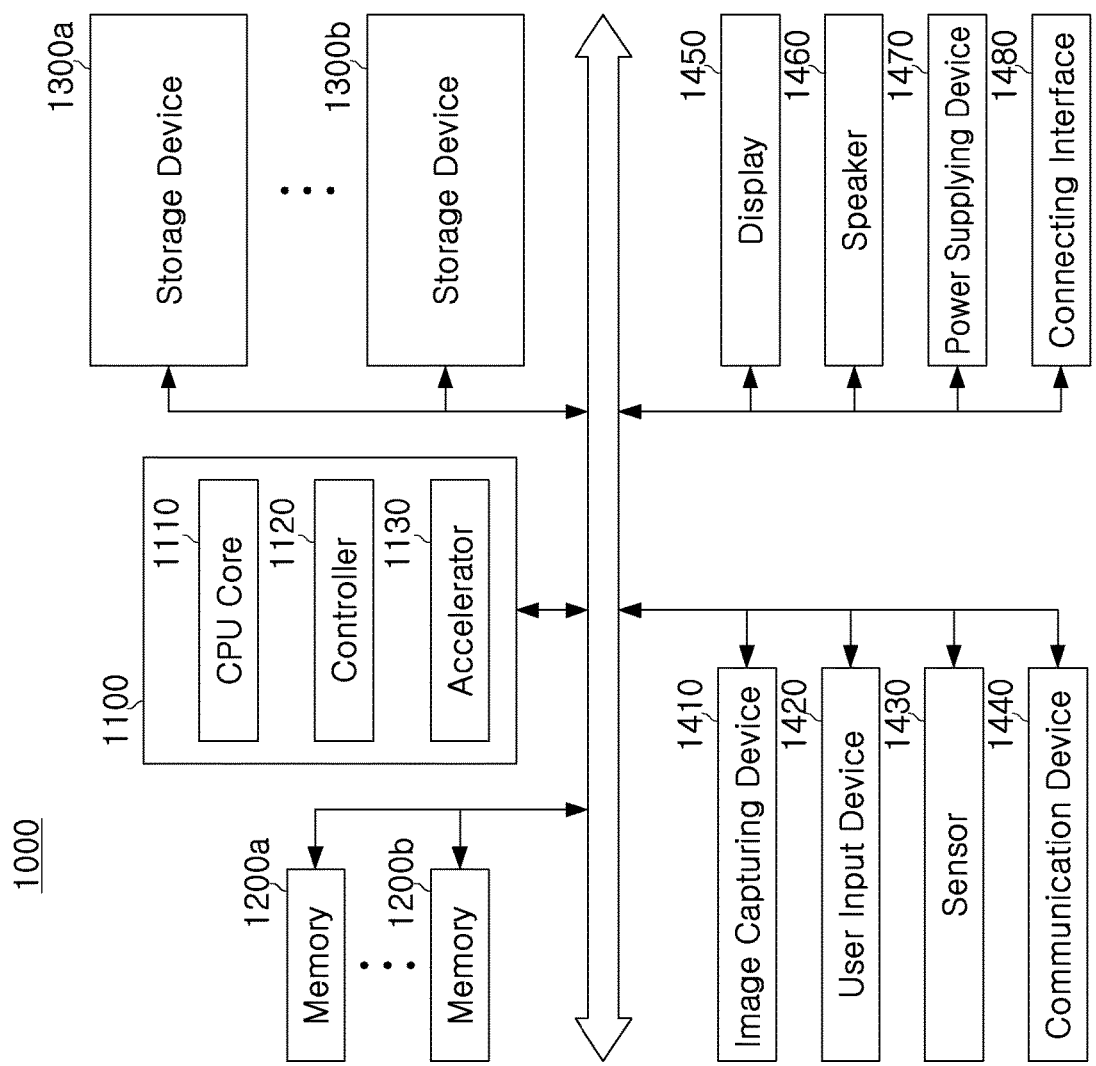
FIG. 12 illustrates a system that uses a memory system according to embodiments of the present inventive concept.

FIG. 12 illustrates a system that uses a memory system according to embodiments of the present inventive concept.

A system 1000 in FIG. 12 is one of a mobile phone, a smart phone, a tablet personal computer (PC), a wearable device, a healthcare device or a mobile system such as an internet of things (JOT) device. However, the system 1000 in FIG. 12 is not necessarily limited to a mobile system, and may be a personal computer, a laptop computer, a server, a media player or an automotive device such as a navigation device.

Referring to FIG. 12, in an embodiment, the system 1000 includes a main processor 1100, memories 1200a and 1200b, and storage devices 1300a and 1300b, and further includes at least one of an image capturing device 1410, a user input device 1420, a sensor 1430, a communications device 1440, a display 1450, a speaker 1460, a power supplying device 1470 or a connecting interface 1480.

The main processor 1100 controls an overall operation of the system 1000, ands operations of other components in the system 1000. The main processor 1100 may be implemented as a general-purpose processor, a dedicated processor, or an application processor, etc.

The main processor 1100 includes at least one CPU core 1110, and further includes a controller 1120 that controls the memories 1200a and 1200b and/or the storage devices 1300a and 1300b. According to embodiments, the main processor 1100 further includes an accelerator 1130 that is a dedicated circuit for high-speed data operation such as artificial intelligence (AI) data operations. The accelerator 1130 may include a graphics processing unit (GPU), a neural processing unit (NPU) and/or a data processing unit (DPU), and may be implemented as a separate chip physically independent from the other components of the main processor 1100.

The memories 1200a and 1200b are main memory devices of the system 1000 and include a volatile memory such as a shadow random access memory (SRAM) and/or the data random access memory (DRAM) and also a non-volatile memory such as a flash memory, a phase-change random access memory (PRAM) and/or a redundant random access memory (RRAM). The memories 1200a and 1200b may be implemented in the same package as the main processor 1100.

The memories 1200a and 1200b correspond to the memory device 200 described with reference to FIG. 1, and the controller 1120 corresponds to the controller 100 described with reference to FIG. 1. The controller 1120 includes a refresh control circuit that controls the refresh operations of the memories 1200a and 1200b.

According to embodiments of the present inventive concept, the counting bloom filter of the controller 1120 performs access counting of rows of the memory cells in the memories 1200a and 1200b, and selects rows for a refresh operation due to the row hammering, based on the access counting result.

The storage devices 1300a and 1300b function as non-volatile storage devices that store data regardless of whether or not power is supplied, and have a relatively large storage capacity as compared to the memories 1200a and 1200b. The storage devices 1300a and 1300b include storage controllers and non-volatile memories (NVM) that store data under control of storage controllers. The nonvolatile memory may include a flash memory that has a two-dimensional (2D) structure or a three-dimensional (3D) vertical NAND (V-NAND) structure, and may include another type of non-volatile memory such as a phase-change random access memory (PRAM) and/or a redundant random access memory (RRAM).

The storage devices 1300a and 1300b may be included in the system 1000 by being physically separated from the main processor 1100, or may be implemented in the same package as the main processor 1100. In addition, the storage device 1300a or 1300b may be a solid state device (SSD) or a memory card, and thus be detachably coupled with the other components of the system 1000 through an interface such as the connecting interface 1480 described below. The storage device 1300a or 1300b uses a standard protocol such as a universal flash storage (UFS), an embedded multi-media card (eMMC), or a non-volatile memory express (NVMe), but is not necessarily limited thereto.

The image capturing device 1410 captures a still image or a moving image, and may be a camera, a camcorder and/or a webcam.

The user input device 1420 receives various types of data from a user of the system 1000, and may include a touch pad, a keypad, a keyboard, a mouse and/or a microphone.

The sensor 1430 detects various types of physical quantities received from outside the system 1000, and converts the detected physical quantities into an electrical signal. The sensor 1430 may be a temperature sensor, a pressure sensor, an illuminance sensor, a position sensor, an acceleration sensor, a biosensor and/or a gyroscope sensor.

The communications device 1440 transmits and receives signals to and from other devices outside the system 1000 according to various communications protocols. The communications device 1440 may be implemented with an antenna, a transceiver and/or a modem.

The display 1450 and the speaker 1460 respectively function as output devices that output visual and auditory information to the user of the system 1000.

The power supplying device 1470 appropriately converts power received from a battery built into the system 1000 and/or an external power source, and transmits the converted power to each component of the system 1000.

The connecting interface 1480 connects the system 1000 to an external device and may exchanges data between the system 1000 and the external device. The connecting interface 1480 may be implemented using various interface methods such as an advanced technology attachment (ATA), a serial-ATA (SATA), an external SATA (e-SATA), a small computer small interface (SCSI), a serial attached SCSI (SAS), a peripheral component interconnection (PCI), a PCI-express (PCI-E), a nonvolatile memory express (NVMe), IEEE 1394, a universal serial bus (USB), a secure digital (SD) card, a multi-media card (MMC), an embedded MMC (eMMC), a universal flash storage (UFS), an embedded universal flash storage (eUFS), and/or a compact flash (CF) card interface.

As described above, embodiments of the present inventive concept provide a refresh control circuit, a refresh control method and a memory system that efficiently select a row of memory cells to be refreshed due to the row hammering.

In detail, embodiments of the present inventive concept provide a refresh control circuit, a refresh control method and a memory system that reduce the counter resources used for access counting by performing access counting for the rows of the memory cells by using the counting bloom filter.

In addition, according to embodiments of the present inventive concept, the counting bloom filter maps an address of one row to several counters by using a plurality of hash functions. A refresh control circuit, a refresh control method and a memory system can be provided that make it challenging for a malicious user to trace an access pattern of the rows of the memory cells, and increase security against row hammering attack.

While embodiments have been illustrated and described above, it will be apparent to those skilled in the art that modifications and variations could be made without departing from the scope of embodiments of the present inventive concept as defined by the appended claims.

What is claimed is:

1. A refresh control circuit for controlling refreshing of a plurality of rows of memory cells, the refresh control circuit comprising:
   a counting bloom filter that includes N hash control logics, wherein N is a positive integer,
   wherein each hash control logic performs a hash operation on input data and outputs an M-bit sequence and M counters, wherein M is a positive integer,
   wherein each counter corresponds to a bit of the M-bit sequence, and that updates count values of corresponding counters of the M counters indicated by values of the M-bit sequences obtained from the N hash logics by using an address of a row of the plurality of rows of the memory cells that is being accessed as the input data;
   a candidate row determiner that determines rows of the memory cells for which the count values of the corresponding counters are greater than a threshold value as candidate rows for a target refresh operation in a predetermined period; and
   a target refresh controller that outputs target refresh signals for rows adjacent to one or more target rows of the candidate rows determined by the candidate row determiner.

2. The refresh control circuit of claim 1, wherein the counting bloom filter determines counters that corresponds to bits of the respective bits of the M-bit sequences that each have a value of '1' as the corresponding counters of the accessed row.

3. The refresh control circuit of claim 1, wherein the counting bloom filter
   outputs the target refresh signals for the rows adjacent to one or more target rows, and
   decreases respective count values of the corresponding counters of the one or more target rows.

4. The refresh control circuit of claim 3, wherein the counting bloom filter decreases the count values by subtracting a minimum value of the count values from respective count values of the corresponding counters of for each of the one or more target rows.

5. The refresh control circuit of claim 1, wherein the target refresh controller determines the one or more target rows by randomly selecting a predetermined number of rows from the candidate rows, based on the number of rows on which the target refresh operation is simultaneously performed.

6. The refresh control circuit of claim 1, wherein the refresh control circuit
   schedules automatic refresh operations that sequentially refresh the plurality of rows of the memory cells, and
   schedules the target refresh operation between the scheduled automatic refresh operations.

7. The refresh control circuit of claim 6, wherein the counting bloom filter decreases the count values of counters that correspond to the rows adjacent to one row of the plurality of rows of the memory cells after an automatic refresh signal is provided for the one row.

8. The refresh control circuit of claim 1, wherein the candidate row determiner determines the candidate rows in the predetermined period after a predetermined time point in a reference time period between target refresh operations adjacent with respect to time.

9. The refresh control circuit of claim 1, further comprising
   a hash logic reconfigurator that reconfigures the N hash logics by periodically changing a hash function applied to each of the N hash logics.

10. The refresh control circuit of claim 1, wherein
    when a row of the plurality of the rows of the memory cells is repeatedly accessed,
    the threshold value is determined based on a limit access count, which is an access count for which data is maintained even when the row adjacent to the repeatedly-accessed row is not refreshed.

11. The refresh control circuit of claim 10, wherein the threshold value is determined based on the limit access count and values of the M counters, and increases for decreasing values of the M counters.

12. A memory system, comprising:
    a memory device that includes a plurality of rows of memory cells; and
    a controller that controls the memory device,
    wherein the controller
    inputs the accessed rows of the plurality of the rows of the memory cells to a counting bloom filter,
    determines rows of the accessed rows as being frequently accessed as candidate rows, based on count values stored in the counting bloom filter, and
    controls the memory device to perform a target refresh operation on rows that are adjacent to a determined target row of the candidate rows.

13. The memory system of claim 12,
    wherein the counting bloom filter performs the access counting for the rows input thereto,
    wherein the counting bloom filter includes a plurality of counters,
    performs a hash operation by inputting addresses of accessed rows into a plurality of hash functions,
    determines corresponding counters indicated by result values of the hash operation, and
    updates the count values of the corresponding counters.

14. The memory system of claim 13, wherein the controller determines as the candidate rows those rows of the accessed rows in which a minimum value of the count values of the corresponding counters is greater than a threshold value.

15. The memory system of claim 13, wherein
    after performing the target refresh operation, the controller determines the corresponding counters of the target row by
inputting the target row to the counting bloom filter and decreasing the count values of the corresponding counters of the determined target row.

16. The memory system of claim 12, wherein
the memory device is a dynamic random access memory (DRAM) device, and
the memory device and the controller are included in one memory chip.

17. The memory system of claim 12, wherein
the memory device is a dynamic random access memory (DRAM) device, and
the controller is a memory controller included in a main processor of a host system that controls the memory device.

18. A refresh control method of a plurality of rows of memory cells, the method comprising:
obtaining a plurality of result values of a first hash operation by
inputting an address of a first row of the plurality of rows of the memory cells into a plurality of hash control logics, and
updating count values of corresponding counters of a plurality of counters that are respectively indicated by the plurality of result values of the first hash operation, in a counting period;
obtaining a plurality of result values of a second hash operation by
inputting an address of a second row of the plurality of rows of the memory cells into the plurality of hash control logics, and
determining the second row as a candidate row for a target refresh operation based on count values of counters of the plurality of counters that are respectively indicated by the plurality of result values of the second hash operation, in a candidate selection period after the counting period; and
performing the target refresh operation for rows adjacent to at least one target row of the candidate rows determined in the candidate selection period.

19. The method of claim 18, wherein the counting period and the candidate selection period are included in a reference time period between target refresh operations adjacent with respect to time, and a length of the reference time period is randomly determined.

20. The method of claim 18, further comprising periodically changing a hash function applied to the plurality of hash control logics.

* * * * *